United States Patent
Sadaka et al.

(10) Patent No.: US 12,344,524 B2
(45) Date of Patent: Jul. 1, 2025

(54) METHODS OF FABRICATING SEMICONDUCTOR STRUCTURES INCLUDING CAVITIES FILLED WITH A SACRIFICIAL MATERIAL

(71) Applicant: Soitec, Bernin (FR)

(72) Inventors: Mariam Sadaka, Austin, TX (US); Ludovic Ecarnot, Grenoble (FR)

(73) Assignee: Soitec, Bernin (FR)

( * ) Notice: Subject to any disclaimer, the term of this patent is extended or adjusted under 35 U.S.C. 154(b) by 149 days.

(21) Appl. No.: 16/921,675

(22) Filed: Jul. 6, 2020

(65) Prior Publication Data

US 2020/0331750 A1    Oct. 22, 2020

Related U.S. Application Data

(63) Continuation of application No. 15/328,371, filed as application No. PCT/EP2014/062137 on Jun. 11, 2014, now Pat. No. 10,703,627.

(Continued)

(51) Int. Cl.
*B81C 1/00* (2006.01)
*B81B 1/00* (2006.01)

(52) U.S. Cl.
CPC .......... *B81C 1/00047* (2013.01); *B81B 1/002* (2013.01); *B81C 1/00158* (2013.01);
(Continued)

(58) Field of Classification Search
CPC ............ B81C 1/00047; B81C 1/00158; B81C 2201/0105; B81C 2201/014; B81B 1/002;
(Continued)

(56) References Cited

U.S. PATENT DOCUMENTS 5,295,395 A    3/1994 Hocker et al.
5,313,836 A    5/1994 Fujii et al.
(Continued)

FOREIGN PATENT DOCUMENTS

CN    101100280 A    1/2008
CN    101998930 A    3/2011
(Continued)

OTHER PUBLICATIONS

Canadian Office Action for CA Application No. 2,916,443 dated Jun. 10, 2020, 4 pages.
(Continued)

*Primary Examiner* — Khaja Ahmad
*Assistant Examiner* — Sun Mi Kim King
(74) *Attorney, Agent, or Firm* — TraskBritt

(57) ABSTRACT

Methods of forming semiconductor structures comprising one or more cavities, which may be used in the formation of microelectromechanical system (MEMS) transducers, involve forming one or more cavities in a first substrate, providing a sacrificial material within the one or more cavities, bonding a second substrate over a surface of the first substrate, forming one or more apertures through a portion of the first substrate to the sacrificial material, and removing the sacrificial material from within the one or more cavities. Structures and devices are fabricated using such methods.

20 Claims, 5 Drawing Sheets

Related U.S. Application Data

(60) Provisional application No. 61/840,333, filed on Jun. 27, 2013.

(52) U.S. Cl.
CPC ............ *B81B 2203/0127* (2013.01); *B81B 2203/0315* (2013.01); *B81C 2201/0105* (2013.01); *B81C 2201/014* (2013.01); *B81C 2201/0192* (2013.01); *H01L 2221/1063* (2013.01); *H01L 2224/03001* (2013.01)

(58) Field of Classification Search
CPC .... B81B 2203/0315; B81B 2203/0127; H01L 2221/1063; H01L 2224/03001
See application file for complete search history.

(56) References Cited

U.S. PATENT DOCUMENTS

| | | | |
|---|---|---|---|
| 5,963,788 | A | 10/1999 | Barron et al. |
| 6,171,881 | B1 * | 1/2001 | Fujii .................. G01P 15/125 |
| | | | 438/50 |
| 6,303,468 | B1 | 10/2001 | Aspar et al. |
| 6,335,258 | B1 | 1/2002 | Aspar et al. |
| 6,756,286 | B1 | 6/2004 | Moriceau et al. |
| 6,809,044 | B1 | 10/2004 | Aspar et al. |
| 6,946,365 | B2 | 9/2005 | Aspar et al. |
| RE39,484 | E | 2/2007 | Bruel |
| 2003/0141561 | A1 | 7/2003 | Fischer et al. |
| 2005/0157096 | A1 | 7/2005 | Truninger et al. |
| 2009/0325335 | A1 | 12/2009 | Perruchot et al. |
| 2010/0029031 | A1 * | 2/2010 | Perruchot ............ B81C 1/00507 |
| | | | 257/E21.085 |
| 2011/0059565 | A1 | 3/2011 | Yang et al. |
| 2011/0294245 | A1 | 12/2011 | Guenard et al. |
| 2012/0225559 | A1 | 9/2012 | Jackson et al. |
| 2012/0276674 | A1 | 11/2012 | Mehregany |
| 2013/0147021 | A1 | 6/2013 | Puurunen et al. |

FOREIGN PATENT DOCUMENTS

| | | | |
|---|---|---|---|
| CN | 102295264 | A | 12/2011 |
| CN | 102674237 | A | 9/2012 |
| CN | 103168342 | A | 6/2013 |
| EP | 0500234 | A2 | 8/1992 |
| JP | 03-049267 | A | 3/1991 |
| JP | 06-026961 | A | 2/1994 |
| JP | 06-318713 | A | 11/1994 |
| JP | 2003-531017 | | 10/2003 |
| JP | 2010-045333 | A | 2/2010 |
| JP | 2011-016173 | A | 1/2011 |

OTHER PUBLICATIONS

CN First Search Report for CN Application No. 201480036740.9 dated Nov. 17, 2016, 2 pages.
Korean Notice of Preliminary Rejection for KR Application No. 10-2015-7036614 dated Aug. 28, 2020, 9 pages.
Chinese 3rd Notification of Office Actoin for Chinese Application No. 201480036740.9 dated Feb. 2, 2018, 6 pages.
Chinese Notification of Reexamination for Chinese Application No. 201480036740.9 dated Apr. 25, 2019.
Chinese Office Action for Chinese Application No. 201480036740.9 dated Nov. 28, 2016, 6 pages.
Chinese Second Office Action for Chinese Application No. 201480036740.9 dated Jul. 13, 2017, 7 pages.
CN Decision of Rejection for CN Application No. 201480036740.9 dated Aug. 1, 2018, 6 pages.
International Search Report for International Application No. PCT/EP2014/062137 dated Oct. 22, 2014, 4 pages.
International Written Opinion for International Application No. PCT/EP2014/062137 dated Oct. 22, 2014, 4 pages.
Japanese Decision to Grant for Japanese Application No. 2016-522377, dated Aug. 7, 2018, 6 pages with English Translation.
Japanese Notice of Reasons for Refusal for Japanese Application No. 2016-522377, dated Mar. 20, 2018, 18 pages with English Translation.
Japanese Notification of Reasons for Refusal and Search Report for Japanese Application No. 2016-522377 dated Mar. 13, 2018, 8 pages.
Japanese Search Report for Japanese Application No. 2016-522377, dated Mar. 14, 2018, 43 pages with English Translation.
Office Action received for European Patent Application No. 14729653.7, mailed on Sep. 19, 2018, 5 pages.
Korean Notice of Decision of Rejection for Application No. 10-2015-7034414 dated Apr. 1, 2021, 4 pages.

\* cited by examiner

METHODS OF FABRICATING SEMICONDUCTOR STRUCTURES INCLUDING CAVITIES FILLED WITH A SACRIFICIAL MATERIAL

CROSS-REFERENCE TO RELATED APPLICATIONS

This application is a continuation of U.S. patent application Ser. No. 15/328,371, filed Jan. 23, 2017, now U.S. Pat. No. 10,703,627, issued on Jul. 7, 2020, which application is a national phase entry under 35 U.S.C. § 371 of International Patent Application PCT/EP2014/062137, filed Jun. 11, 2014, designating the United States of America and published in English as International Patent Publication WO 2014/206737 A1 on Dec. 31, 2014, which claims the benefit under Article 8 of the Patent Cooperation Treaty and under 35 U.S.C. § 119(e) to U.S. Provisional Patent Application Ser. No. 61/840,333, filed Jun. 27, 2013, the disclosure of each of which is hereby incorporated herein in its entirety by this reference.

TECHNICAL FIELD

The present disclosure relates to methods of forming semiconductor structures that include one or more cavities, and to structures and devices fabricated using such methods.

BACKGROUND

Semiconductor structures are structures that are used or formed in the fabrication of semiconductor devices. Semiconductor devices include, for example, electronic signal processors, electronic memory devices, photoactive devices, and microelectromechanical (MEMS) devices. Such structures and devices often include one or more semiconductor materials (e.g., silicon, germanium, a III-V semiconductor material, etc.), and may include at least a portion of an integrated circuit.

MEMS devices are devices that have both physically active features and electrically active features. The active features of MEMS devices may have micro-scale and/or nano-scale features. For example, MEMS devices may have active features having cross-sectional dimensions of about 100 μm or less.

MEMS devices often comprise a transducer that converts electrical energy in the form of, for example, a voltage or current into kinetic energy (physical energy) in the form of, for example, mechanical deflection or vibrations, or that converts kinetic energy into electrical energy. For example, MEMS devices include resonators that generate resonant mechanical vibrations responsive to an applied electrical signal. MEMS devices also include sensors that are used to sense physical phenomena (e.g., deflection, pressure, vibrations, etc.), by sensing variations in an electrical signal caused by the physical phenomena. Some MEMS devices may be characterized as both resonators and sensors.

Many types of resonators are known in the art and include, for example, plate acoustic wave resonators, flexural mode resonators, bulk acoustic wave (BAW) resonators, surface acoustic wave (SAW) resonators, and film bulk acoustic resonators (FBARs).

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes a method of fabricating a semiconductor structure. In accordance with the method, one or more cavities is formed in a first substrate. The one or more cavities extend at least partially into the first substrate from a first major surface of the first substrate. A sacrificial material is provided within the one or more cavities. A second substrate is bonded over the first major surface of the first substrate, and the second substrate is thinned by removing a relatively thick layer of the second substrate from the second substrate and leaving a relatively thin layer of the second substrate bonded over the first major surface of the first substrate. One or more apertures is formed through the relatively thin layer of the second substrate, and the sacrificial material is removed from within the one or more cavities out though the one or more apertures.

In additional embodiments, the present disclosure includes a semiconductor structure comprising one or more cavities extending at least partially through a first substrate from a first major surface of the first substrate. A sacrificial material is disposed within the one or more cavities. A liner material extends over a surface of the first substrate within the one or more cavities, and the liner material is disposed between the surface of the first substrate and the sacrificial material. A relatively thin layer is disposed over the first major surface of the first substrate and extends over the sacrificial material disposed within the one or more cavities. One or more apertures extends through the relatively thin layer, and the one or more apertures are disposed adjacent the sacrificial material.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

FIGS. 1 through 13 illustrate an example of a method that may be used to form semiconductor structures useful for fabricating MEMS transducers and devices, the structures comprising one or more cavities that may be temporarily filled with a sacrificial material;

FIG. 1 is a simplified cross-sectional view illustrating a substrate;

FIG. 2 illustrates cavities formed in the substrate of FIG. 1;

FIG. 4 illustrates a structure formed by providing a sacrificial material within the cavities of FIG. 2;

FIG. 5 illustrates a bonding layer formed over the structure of FIG. 4;

FIG. 6 illustrates a second substrate including a fracture plane;

FIG. 7 illustrates the second substrate of FIG. 6 bonded to the structure of FIG. 5;

FIG. 8 illustrates a protective dielectric layer formed over a surface of the structure of FIG. 7;

FIG. 9 illustrates apertures etched through a relatively thin layer of material of the structure of FIG. 8;

FIG. 10 illustrates an additional protective dielectric layer formed over a surface of sidewalls within the apertures;

FIG. 11 illustrates a structure formed by removing the sacrificial material from within the one or more cavities in the substrate;

FIG. 12 illustrates a plan view of the structure of FIG. 2; and

FIG. 13 illustrates a portion of a semiconductor device comprising a MEMS transducer formed from the structure of FIG. 11.

DETAILED DESCRIPTION

The illustrations presented herein are not meant to be actual views of any particular semiconductor material, structure, or device, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

As used herein, the term "III-V semiconductor material" means and includes any semiconductor material that is at least predominantly comprised of one or more elements from group IIIA of the periodic table (B, Al, Ga, In, and Tl) and one or more elements from group VA of the periodic table (N, P, As, Sb, and Bi). For example, III-V semiconductor materials include, but are not limited to, GaN, GaP, GaAs, InN, InP, InAs, AlN, AlP, AlAs, InGaN, InGaP, GaInN, InGaNP, GaInNAs, etc.

The present disclosure includes methods that may be used to form structures that include one or more cavities. The structures may be utilized for the fabrication of MEMS devices, such as MEMS resonators and/or MEMS sensors. Examples of such methods are disclosed in further detail below.

FIGS. 1 through 13 illustrate a non-limiting example of a method that may be used to form a semiconductor structure that includes one or more cavities, wherein the one or more cavities may be utilized for forming one or more MEMS transducers.

Figure 1:
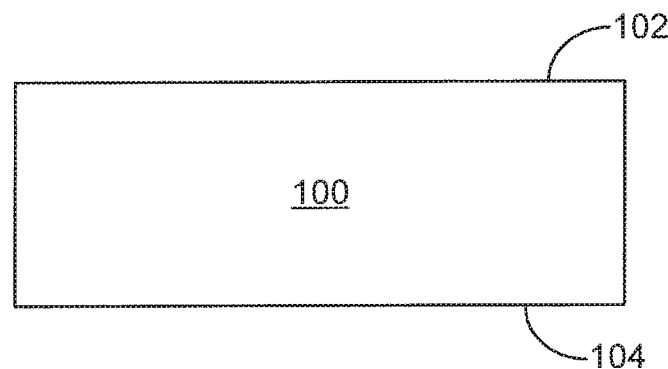

FIG. 1 is a simplified cross-sectional side view of a substrate 100. The substrate 100 may comprise what is referred to in the art as a "die" or a "wafer," and may be generally planar. The substrate 100 may comprise any of a number of materials conventionally used for substrates in the fabrication of integrated circuits. As non-limiting examples, the substrate 100 may comprise an oxide (e.g., aluminum oxide, zirconium oxide, silicon oxide, etc.), a nitride (e.g., silicon nitride), a carbide (e.g., silicon carbide), or a semiconductor material (e.g., silicon, germanium, a III-V semiconductor material, etc.). The substrate 100 may comprise an amorphous material in some embodiments. In other embodiments, the substrate 100 may comprise a crystalline material (e.g., polycrystalline or monocrystalline material). Further, the substrate 100 may be at least substantially comprised by a single, generally homogeneous material, or the substrate 100 may comprise a multi-layer structure. As shown in FIG. 1, the substrate includes a first major surface 102 on one side of the substrate 100, and a second major surface 104 on an opposite side of the substrate 100 from the first major surface 102.

Figure 2:
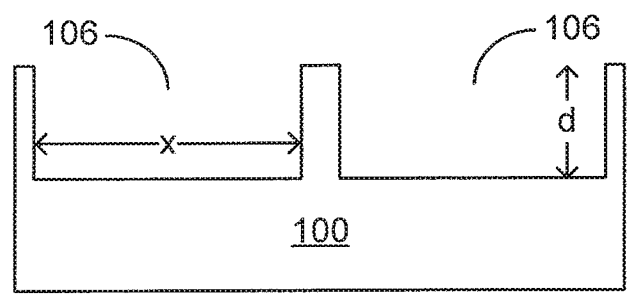

Referring to FIG. 2, one or more cavities 106 may be formed in the substrate 100. The cavities 106 may be formed into the first major surface 102 of the substrate 100. In other words, the cavities 106 may extend into the substrate 100 from the first major surface 102 thereof. The one or more cavities 106 may be ultimately used to form at least a portion of a MEMS transducer. FIG. 2 illustrates two (2) cavities 106 in the substrate 100, although the substrate 100 may in fact include any number (one or more) of cavities 106. The cavities 106 may be formed in the first major surface 102 of the substrate 100 using, for example, a photolithographic masking and etching process. In such embodiments, a mask material may be deposited over the first major surface 102 of the substrate 100, and the mask material may be selectively patterned to form openings through the mask material at the locations at which it is desired to etch into the substrate 100 to form the cavities 106. After forming such a patterned mask layer, the region or regions of the substrate 100 exposed through the openings in the patterned mask layer may be etched using, for example, a wet chemical etching process or a dry reactive ion etching process to form the cavities 106 in the substrate 100 through the first major surface 102. After the etching process, the patterned mask layer may be removed.

As one non-limiting example, in embodiments in which the substrate 100 comprises silicon, the cavities 106 may be etched in the substrate 100 using a wet chemical etching process in which a solution comprising between about 20% and about 50% by volume potassium hydroxide (KOH), and between about 50% and about 80% by volume water ($H_2O$) is used. The etching process may be carried out at a temperature of between about twenty degrees Celsius (20° C.) and about one hundred degrees Celsius (100° C.) for a sufficient time to form the cavities 106, and such that the cavities 106 have desirable dimensions. As another non-limiting example, the cavities 106 may be etched in the substrate 100 using a dry plasma etching process, which may employ chlorine-based and/or fluorine-based reactive ion etchant species in embodiments in which the substrate 100 comprises a silicon semiconductor material.

As non-limiting examples, the one or more cavities 106 may extend an average depth (d) into the substrate 100 from the first major surface 102 (the vertical dimension from the perspective of FIG. 2) that is at least about one micron (1 µm), at least about ten microns (10 µm), at least about one hundred microns (100 µm), at least about two hundred microns (200 µm), or even five hundred microns (500 µm) or more. Additionally, the cavities 106 may have an average cross-sectional dimension (e.g., a width (X), a length (Y), a diameter, etc.) parallel to the first major surface 102 and/or the second major surface 104 of the substrate 100 (the horizontal dimension from the perspective of FIG. 2) of at least about fifty microns (50 µm), at least about five hundred microns (500 µm), at least about one thousand microns (1,000 µm), or even greater.

The cross-sectional shape of the cavities 106 may depend on whether the etchant employed in the etching process is an isotropic etchant or an anisotropic etchant, as well as on the cross-sectional shape of the openings in the patterned mask layer through which the cavities 106 are etched in the substrate 100, as previously discussed. The cavities 106 may have any desirable size and shape, and the desired size and shape may be at least partially a function of the type and configuration of the MEMS transducers that may be subsequently formed using the cavities 106. In embodiments in which the cavities 106 are utilized as MEMS transducers for resonators, the frequencies at which the resonators resonate may be at least partially a function of the size and shape of the cavities 106, and the size and shape of the cavities 106 may be designed and selected to provide desirable resonant frequencies.

Figure 12:
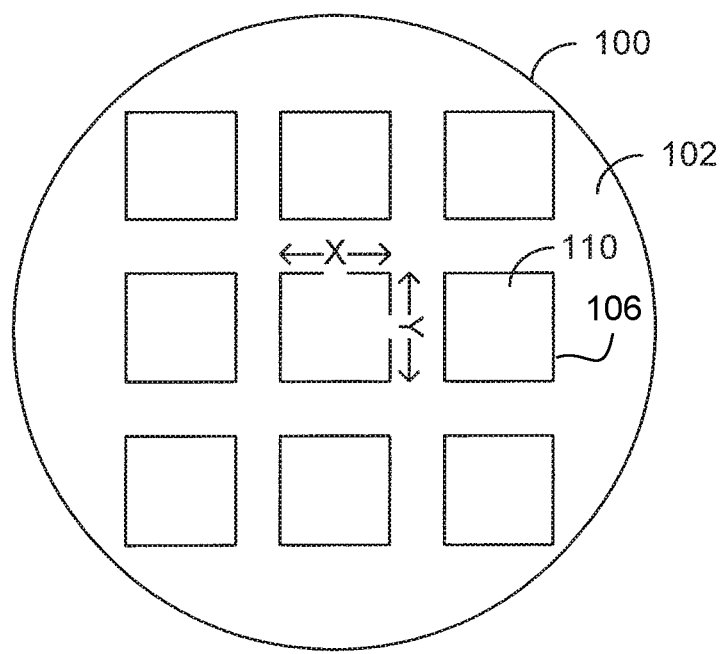

Referring again to FIG. 2, the one or more cavities 106 in the first substrate 100 may be formed to have a total sum cross-sectional area in a plane parallel to the first major surface 102 of the first substrate 100 of at least thirty percent (30%), at least forty percent (40%), or at least fifty percent (50%) of the area encompassed by a peripheral edge of the first substrate 100 at the first major surface 102 of the first substrate 100. A non-limiting example is illustrated in FIG. 12, which illustrates a plan view of the cavities 106 formed in the first substrate 100 from the first major surface 102 thereof. The total sum cross-sectional area of the cavities 106 is the sum of the individual areas of each of the cavities 106. As illustrated in FIG. 12, the cavities 106 may have a rectangular configuration, and the first major surface 102 of the first substrate 100 may have a circular configuration. In other embodiments, however, the configurations of one or more cavities 106 and the first substrate 100 may have alternate forms.

Figure 3A:
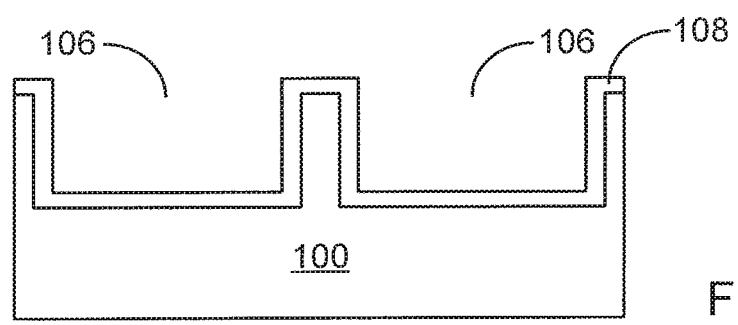
FIG. 3A illustrates a liner material formed on or in surfaces of the substrate within the cavities of FIG. 2.

After forming the cavities 106, a liner material 108 optionally may be formed on or in surfaces of the first substrate 100 within the one or more cavities 106, as shown in FIG. 3A. The liner material 108 may serve any of a number of purposes. By way of example and not limitation, the liner material 108 may serve as an etch stop layer for use in removing a temporary filler sacrificial material to be deposited in the cavities 106, as discussed in further detail below.

With continued reference to FIG. 3A, the liner material 108 may be formed in a conformal manner over the exposed surfaces of the substrate 100 within the cavities 106 and at the first major surface 102 (FIG. 1) of the first substrate 100. The liner material 108 may be deposited or otherwise provided on or in the surfaces of the substrate 100 within the cavities 106 using a deposition process (e.g., a physical vapor deposition (PVD) process or a chemical vapor deposition (CVD) process) or a growth process, such as a thermal growth process (e.g., thermal oxidation or thermal nitridation).

The liner material 108 may comprise one or materials. In some embodiments, the first substrate 100 may comprise a first material, and the liner material 108 may comprise a second material different from the first material of the first substrate 100. As a non-limiting example, the first material of the first substrate 100 may be substantially comprised of crystalline silicon (monocrystalline or polycrystalline), and the second material of the liner material 108 may comprise at least one of a silicon oxide and a silicon nitride.

With continued reference to FIG. 3A, a non-limiting example is illustrated in which the liner material 108 comprises a layer of silicon oxide (e.g., $SiO_2$) conformally formed over the exposed surfaces of the substrate 100 within the one or more cavities 106 and remaining portions of the first major surface 102 by a thermal oxidation growth process. Thermal oxidation growth processes may be utilized due to the inherent conformality of the thermal growth process. The liner material 108 may be formed to an average layer thickness of greater than about twenty (20) nanometers, greater than about forty (40) nanometers, or even greater than about sixty (60) nanometers. In some embodiments, the liner material 108 may be thermally treated upon or after formation thereof to increase the density of the liner material 108. As a non-limiting example, the liner material 108 may be thermally treated by heating the liner material 108 in a suitable furnace, as known in the art, to a temperature of greater than approximately 400° C.

Figure 3B:
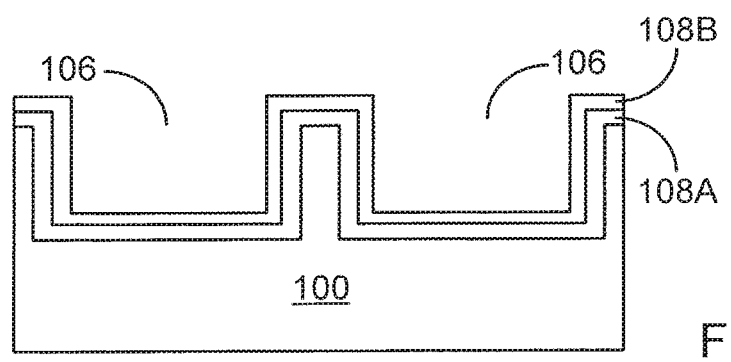
FIG. 3B illustrates an additional liner material formed over the liner material of FIG. 3A.

FIG. 3B illustrates another non-limiting example in which the liner material 108 comprises two materials. In particular, the embodiment of FIG. 3B includes a first liner material 108A and a second liner material 108B. The first liner material 108A may comprise a layer of silicon oxide (e.g., $SiO_2$) conformally formed over the exposed surfaces of the substrate 100 within the one or more cavities 106 and the remaining portions of the first major surface 102 by a thermal oxidation growth process. The first liner material 108A may be formed to an average layer thickness of greater than about twenty (20) nanometers, greater than about forty (40) nanometers, or even greater than about sixty (60) nanometers. The second liner material 108B may comprise a layer of silicon nitride (e.g., $Si_3N_4$) formed conformally over the surface of the first liner material 108A. The second liner material 108B may be formed to an average layer thickness of greater than about twenty (20) nanometers, greater than about forty (40) nanometers, or even greater than about sixty (60) nanometers, and may be formed utilizing methods as described herein above. The first liner material 108A and the second liner material 108B (e.g., the layer of silicon oxide and the layer of silicon nitride) collectively comprise the liner material 108.

Figure 4:
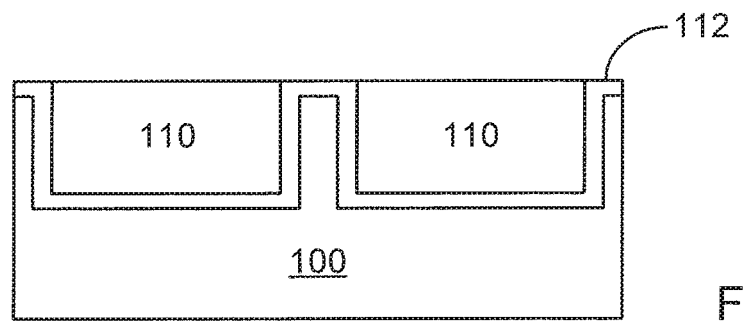

Referring to FIG. 4, a sacrificial material 110 may be provided within the one or more cavities 106 such that the sacrificial material 110 at least substantially fills the one or more cavities 106. The sacrificial material 110 may be deposited within the one or more cavities 106 using a deposition process, such as physical vapor deposition (PVD) or chemical vapor deposition (CVD), using a spin-on-glass process or a spin-on-polymer process, or using a growth process, such as a thermal growth process (e.g., thermal oxidation or thermal nitridation). Upon depositing the sacrificial material 110 in the cavities 106, excess sacrificial material 110 may be disposed over the first major surface 102 of the first substrate 100. Optionally, a planar surface 112 may be formed by planarizing exposed surface(s) of the sacrificial material 110 by removing a portion of the sacrificial material 110 to form the planar surface 112, as discussed in further detail below.

The sacrificial material 110 may comprise any of a number of materials conventionally used in the semiconductor industry for the fabrication of integrated circuits. The sacrificial material 110 may comprise a material that exhibit a Young's modulus (i.e., a modulus of elasticity) of about 250 gigapascals or less, or even about 200 gigapascals or less, when tested in accordance with ASTM International Standard E8/E8M-09 (entitled "Standard Test Methods for Tension Testing of Metallic Materials") at a temperature of about 1,000° C. or less.

The sacrificial material 110 may comprise, for example, a ceramic material, a metal material, a polymer material, or a semiconductor material. Additionally, the sacrificial material 110 may be crystalline (monocrystalline or polycrystalline) or amorphous. As one non-limiting example, the sacrificial material 110 may comprise polycrystalline silicon. As additional examples, the sacrificial material 110 may comprise a glassy material, such as an inorganic spin-on-glass (e.g., perhydro-polysilazane-based, siloxane-based and silicate-based), a doped or undoped silicate glass, a doped or undoped quasi-inorganic siloxane spin-on-glass (SOG), a phosphosilicate glass (PSG), a borosilicate glass (BSG), or a borophosphosilicate glass (BPSG). In further embodiments, the sacrificial material 110 may comprise a polymeric material such as a polyimide, or an acetate, such as 1-methoxy-2-propanol acetate. Further, the sacrificial material 110 may be at least substantially comprised by a single, generally homogeneous material, or the sacrificial material 110 may comprise a multi-layer structure including two or more layers or regions of different materials.

The sacrificial material 110 may be deposited in a conformal or non-conformal manner with sufficient thickness to at least substantially fill the one or more cavities 106. In other words, the sacrificial material 110 may be formed to a thickness of approximately equal to or greater than the depth (d) of the cavities 106. Thus, in some embodiments, the sacrificial material 110 may be deposited to a thickness of at least about one micron (1 µm), at least about ten microns (10 µm), at least about one hundred microns (100 µm), at least about two hundred microns (200 µm), or even five hundred microns (500 µm) or more.

As previously mentioned, the deposition of the sacrificial material 110 may result in undesirable deposition of excess sacrificial material 110 over the first major surface 102 of the first substrate 100. Therefore, upon forming the sacrificial material 110, a planarizing process may be utilized. The exposed surface of the sacrificial material 110 may be planarized by removing a portion of the sacrificial material 110 and forming a planar surface 112 parallel to the first major surface 102 and/or the second major surface 104 of the first substrate 100, as illustrated in FIG. 4. For example, one or more of a polishing process, an etching process, and a chemical-mechanical polishing (CMP) process may be used to planarize the surface of the sacrificial material 110 and form the planar surface 112. The planar surface 112 may comprise regions of the sacrificial material 110 and exposed regions of the liner material 108 in some embodiments. The liner material 108 may serve as a stop layer in the planarization process used to remove excess sacrificial material 110, and may prevent removal of any sacrificial material 110 within the cavities 106 and removal of any portion of the substrate 100. The liner material 108 may serve as a stop layer due to the resistance to removal of the liner material 108 (i.e., a relatively lower rate of removal of the liner material 108) in comparison with the sacrificial material 110 during the planarization process (e.g., a CMP process). Thus, in some embodiments, the liner material 108 is selected such that the liner material 108 has a greater resistance to removal than does the sacrificial material 110 during the planarization process.

After providing the sacrificial material 110 in the cavities 106, a relatively thin layer of material may be provided over the first major surface 102 of the substrate 100 and over the cavities 106, as described below with reference to FIGS. 5 through 8.

Figure 6:
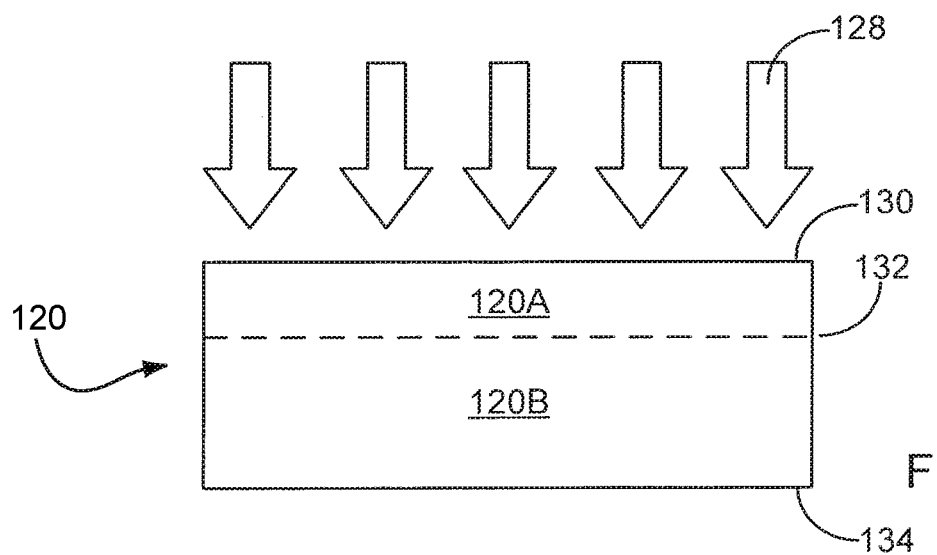
Figure 7:
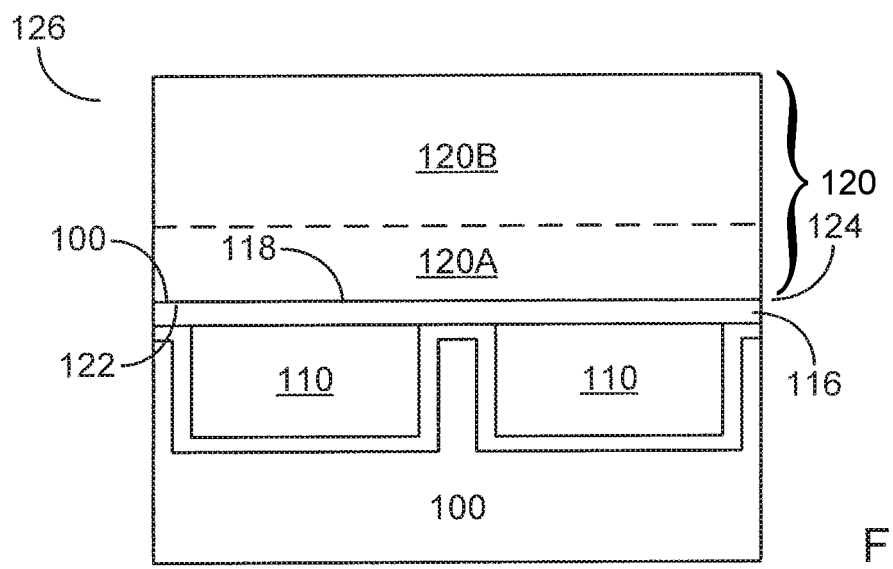
Figure 8:
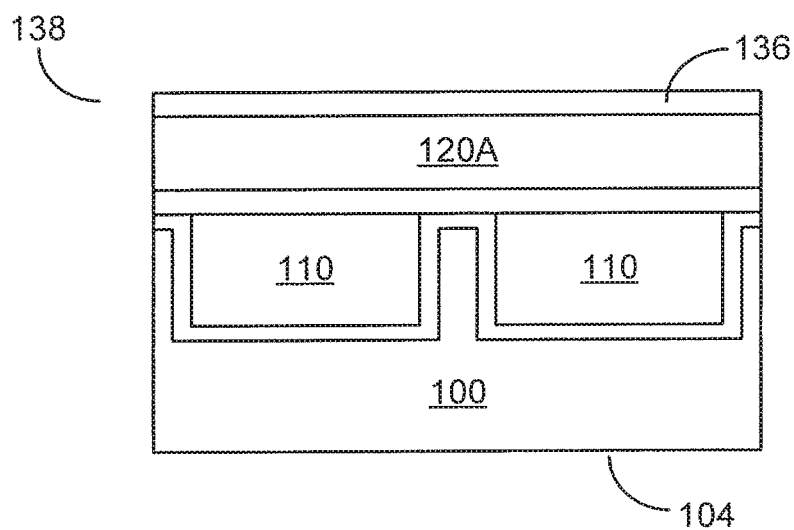

Briefly, in some embodiments, a second substrate 120 as shown in FIG. 6 may be bonded over the first major surface 102 of the first substrate 100 to form the bonded structure shown in FIG. 7, after which the second substrate 120 may be thinned by removing a relatively thick layer 120B of the second substrate 120 and leaving a relatively thin layer 120A of the second substrate 120 bonded over the first major surface 102 of the first substrate 100 as shown in FIG. 8.

Figure 5:
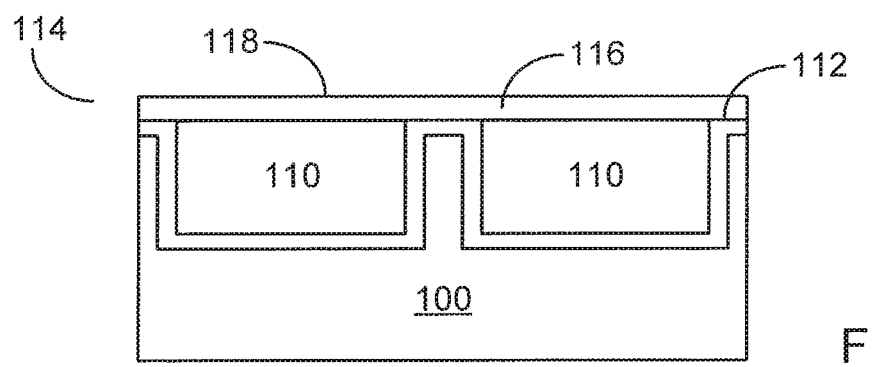

Referring to FIG. 5, to prepare the first substrate 100 for bonding to the second substrate 120 (FIG. 6), a bonding layer 116 may be provided over the planar surface 112 to form the intermediate semiconductor structure 114 of FIG. 5. As a non-limiting example, the bonding layer 116 may comprise one or more of an oxide (e.g., silicon oxide), a nitride (e.g., silicon nitride) or a metallic material. In some embodiments, the bonding layer 116 may comprise a silicon oxide formed by a physical vapor deposition (PVD) process, a chemical vapor deposition (CVD) process, a spin-on-glass process, a spin-on-polymer process, and/or a growth process, such as a thermal growth process (e.g., thermal oxidation or thermal nitridation). The bonding layer 116 may have an average layer thickness of greater than about one (1) nanometer, greater than about fifty (50) nanometers, or even greater than about one (1) micron.

The bonding layer 116 may be formed to comprise a bonding surface 118 having a root mean square surface roughness ($R_{RMS}$) of about two nanometers (2.0 nm) or less, about one nanometer (1.0 nm) or less, or even about one-quarter of a nanometer (0.25 nm) or less. The bonding surface 118 of the bonding layer 116 may be smoothed using at least one of a mechanical polishing process and a chemical etching process. For example, a chemical-mechanical polishing (CMP) process may be used to planarize and/or reduce the surface roughness of the bonding surface 118 of the bonding layer 116 in preparation for the bonding process.

After smoothing the bonding surface 118 of bonding layer 116, the bonding surface 118 optionally may be cleaned and/or activated using processes known in the art. For example, an activation process may be used to alter the surface chemistry at the bonding surface 118 in a manner that facilitates a bonding process and/or results in the formation of a stronger bond between the bonding surface 118 of the bonding layer 116 and a bonding surface of the second substrate 120 (FIG. 6) to be bonded to the first substrate 100.

FIG. 6 illustrates the second substrate 120 to be bonded to the first substrate 100 of FIG. 5. The second substrate 120 may be at least substantially comprised by a single, generally homogeneous material, or the second substrate 120 may comprise a multi-layer structure. As non-limiting examples, the second substrate 120 may comprise an oxide (e.g., aluminum oxide, zirconium oxide, silicon oxide, etc.), a nitride (e.g., silicon nitride), a carbide (e.g., silicon carbide), or a semiconductor material (e.g., silicon, germanium, a III-V semiconductor material, etc.). The second substrate 120 may comprise an amorphous material in some embodiments. In other embodiments, the second substrate 120 may comprise a crystalline material (e.g., polycrystalline or monocrystalline material). As discussed in further detail below, to facilitate the thinning of the second substrate 120 after bonding the second substrate 120 to the first substrate 100, ions may be implanted into the second substrate 120 along a fracture plane 132, which may define the relatively thin layer 120A of the second substrate 120 and the relatively thick layer 120B on opposing sides of the fracture plane 132.

As shown in FIG. 7, the second substrate 120 may be bonded over the first major surface 102 of the first substrate 100 to form the intermediate structure 126 shown therein. The second substrate 120 may be bonded over the first substrate 100 such that the relatively thin layer 120A of the second substrate 120 is disposed between the first major surface 102 of the first substrate 100 and the relatively thick layer 120B of the second substrate 120. In some embodiments, the relatively thin layer 120A of the second substrate 120 may be bonded to the first major surface 102 of the first substrate 100 using a direct bonding process without using any adhesive therebetween.

The relatively thin layer 120A may be bonded to the first major surface 102 of the first substrate 100 using a direct bonding process in which the relatively thin layer 120A is directly bonded to the first major surface 102 of the first substrate 100 by providing direct atomic bonds therebetween. In other words, the relatively thin layer 120A may be directly bonded to the first substrate 100 without using an adhesive. The nature of the atomic bonds between the relatively thin layer 120A of the second substrate 120 and the first substrate 100 will depend upon the material compositions at the surfaces of each of the bonding surface 118 of the first substrate 100 and the bonding surface 130 (FIG. 6) of the second substrate 120.

In some embodiments, a second bonding layer 116 may be provided on the exposed surface 122 of the relatively thin layer 120A prior to the bonding process, and the second bonding layer 116 may be as previously described with reference to the bonding layer 116 provided on the first substrate 100. For example, silicon dioxide ($SiO_2$) may be provided on a major surface 122 of the relatively thin layer of material 120A of the second substrate 120. Thus, in accordance with such embodiments, direct atomic bonds may be provided between silicon dioxide at the exposed first major surface 122 of the second substrate 120 and at the first major surface 102 of the first substrate 100. Stated another way, the bonding surface 130 of the relatively thin layer 120A of the second substrate 120 may comprise an oxide material (e.g., silicon dioxide ($SiO_2$), which is a dielectric material) and the bonding surface 118 of the first substrate 100 may be at least substantially comprised of the same oxide material (e.g., silicon dioxide ($SiO_2$)). In such embodiments, a silicon oxide-to-silicon oxide surface direct bonding process may be used to bond the bonding surface 118 of the first substrate 100 to the bonding surface 130 of the second substrate 120. In such embodiments, as shown in FIG. 7, a bonding material 116 (e.g., a dielectric layer, such as an oxide (e.g., silicon dioxide)) may be disposed between the first substrate 100 and the second substrate 120 at a direct bonding interface 124 between the relatively thin layer of material 120A of the second substrate 120 and the planar surface 112 (FIG. 5) of the first substrate 100. The bonding material 116 may have an average thickness of, for example, between about one nanometer (1 nm) and about one micron (1 μm).

In additional embodiments, a substantial portion of the bonding surface 118 of the first substrate 100 may comprise a semiconductor material, such as silicon, and the bonding surface 130 of the second substrate 120 may be at least substantially comprised of the same semiconductor material (e.g., silicon). In such embodiments, a silicon-to-silicon surface direct bonding process may be used to bond the first substrate 100 to the second substrate 120. In additional embodiments, the bonding surface 118 of the first substrate 100 and the bonding surface 130 of the second substrate 120 may comprise a metallic material, such as copper, gold, aluminum or a eutectic composition, such as one or more of Au:Sn, Au:Si, Au:Ge, Al:Ge, Au:In.

The bonding surfaces 118, 130 may be brought into direct physical contact with one another, and pressure may be applied in a localized area of the bonding interface 124. Inter-atomic bonds may be initiated in the vicinity of the localized pressure area, and a bonding wave may propagate at a rapid rate across the interface between the bonding surfaces 118, 130 to form the direct bonding interface 124.

Optionally, an annealing process may be used to strengthen the bond between the first substrate 100 and the second substrate 120. Such an annealing process may include heating of the relatively thin layer of material 120A of the second substrate 120 and the first substrate 100 in a furnace at a temperature of between about one hundred degrees Celsius (100° C.) and about one thousand degrees Celsius (1,000° C.) for a time of between about two minutes (2 mins.) and about fifteen hours (15 hrs.).

Upon bonding the second substrate 120 to the first substrate 100, the second substrate 120 may be subjected to further processes to thin the second substrate 120 as previously mentioned, and remove the relatively thick layer 120B and expose a surface of the relatively thin layer 120A on a side thereof opposite the first substrate 100. For example, the relatively thick layer 120B may be removed from the relatively thin layer 120A, leaving the relatively thin layer 120A bonded over the planar surface 112 of the first substrate 100 comprising the sacrificial material 110 and the liner material 108.

By way of example and not limitation, the SMART CUT® process may be used to separate the relatively thick layer of material 120B from the relatively thin layer of material 120A of the second substrate 120. Such processes are described in detail in, for example, U.S. Pat. No. RE 39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of which are incorporated herein in their entireties by this reference.

Briefly, and with reference to FIG. 6, a plurality of ions 128 (e.g., one or more of hydrogen, helium, or inert gas ions) may be implanted into the second substrate 120. In some embodiments, the plurality of ions 128 may be implanted into the second substrate 120 through the major surface 130 prior to bonding the major surface 130 of the second substrate 120 to the first substrate 100. For example, ions 128 may be implanted into the second substrate 120, prior to bonding, from an ion source positioned on a side of the second substrate 120 adjacent to the surface 130, as illustrated in FIG. 6.

Ions may be implanted into the second substrate 120 in a direction substantially perpendicular to the major surface 130 of the second substrate 120. As known in the art, the depth at which the ions are implanted into the second substrate 120 is at least partially a function of the energy with which the ions are implanted into the second substrate 120. Generally, ions implanted with less energy will be implanted at relatively shallower depths, while ions implanted with higher energy will be implanted at relatively deeper depths.

Ions may be implanted into the second substrate 120 with a predetermined energy selected to implant the ions at a desired depth within the second substrate 120 so as to define the fracture plane 132 therein. The ions may be implanted into the second substrate 120 before or after bonding the layer of second substrate 120 to the first substrate 100. As one particular non-limiting example, the fracture plane 132 may be disposed within the second substrate 120 at an average depth from the first major surface 130, such that the average thickness of the relatively thin layer 120A of the second substrate 120 is in a range extending from about one hundred nanometers (100 nm) to about one thousand nanometers (1,000 nm). As known in the art, at least some ions are inevitably implanted at depths other than the desired implantation depth, and a graph of the concentration of the ions as a function of depth into the second substrate 120 from the exposed major surface 130 (e.g., prior to bonding) may exhibit a generally bell-shaped (symmetric or asymmetric) curve having a maximum at the desired implantation depth.

Upon implantation of the ions 128 into the second substrate 120, the ions 128 define the fracture plane 132

(illustrated as a dashed line in FIG. 6) within the second substrate 120. The fracture plane 132 may comprise a layer or region within the second substrate 120 that is aligned with and extends along the plane of maximum ion concentration within the second substrate 120. The fracture plane 132 may define a plane within the second substrate 120 along which the second substrate 120 may be cleaved or fractured in a subsequent process to transfer the relative thin layer of material 120A to the first substrate 100. For example, the second substrate 120 may be heated to cause the second substrate 120 to cleave or fracture along the fracture plane 132. Optionally, mechanical and/or chemical energy also may be applied to cause or assist in the cleaving of the second substrate 120 along the fracture plane 132.

In additional embodiments, the relatively thin layer 120A may be provided over the first substrate 100 by bonding a relatively thick second substrate 120 (e.g., a substrate having an average thickness of greater than about 100 microns) to the first substrate 100, and subsequently thinning the relatively thick second substrate 120 from the side thereof opposite the first substrate 100. The second substrate 120 may be thinned by removing material from an exposed second major surface 134 (FIG. 6) of the second substrate 120. For example, the second substrate 120 may be thinned using a chemical process (e.g., a wet or dry chemical etching process), a mechanical process (e.g., a grinding or lapping process), or by a chemical-mechanical polishing (CMP) process.

Upon thinning the second substrate 120 to leave the thin layer of material 120A bonded over the first substrate 100 as shown in FIG. 8, a protective dielectric layer 136 optionally may be formed over an exposed surface of the relatively thin layer of material 120A on a side thereof opposite the first substrate 100 to form the intermediate structure 138 illustrated in FIG. 8. The protective dielectric layer 136 may comprise one or more of a silicon oxide and/or a silicon nitride. The protective dielectric layer 136 may be deposited over the relatively thin layer 120A using one or more of a deposition process (e.g., a physical vapor deposition (PVD) process or a chemical vapor deposition (CVD) process) and a growth process, such as a thermal growth process (e.g., thermal oxidation or thermal nitridation). The protective dielectric layer 136 may act as an etch stop layer for subsequent processes utilized in the formation of MEMS cavities. The protective dielectric layer 136 may have an average layer thickness of, for example, between about one nanometer (1 nm) and about one micron (1 μm). In some embodiments, the protective dielectric layer 136 may be thermally treated to increase the density of the protective dielectric layer 136. As a non-limiting example, the protective dielectric layer 136 may be heated in a suitable furnace, as known in the art, to a temperature of greater than approximately 400° C. to densify the protective dielectric layer 136.

Figure 9:
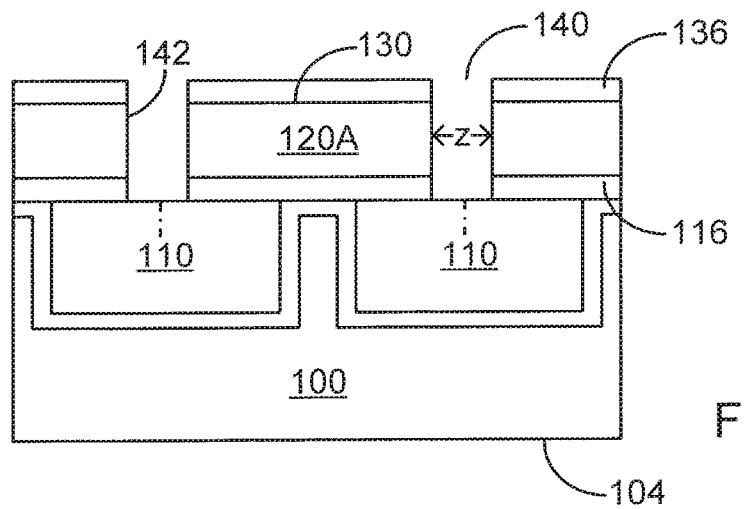

Referring to FIG. 9, one or more apertures 140 may be formed that extend through the relatively thin layer 120A to the sacrificial material 110. As discussed in further detail below, the sacrificial material 110 may be removed from within the cavities 106 in the first substrate 100 out through the one or more apertures 140. Thus, the apertures 140 may be located adjacent to, and may be aligned with the sacrificial material 110. Further, the one or more apertures 140 may extend through the protective dielectric layer 136, the relatively thin layer 120A, and the bonding layer 116 (if present). One or more surfaces of the underlying sacrificial material 110 may be exposed through the apertures 140. The one or more apertures 140 may have an average cross-sectional dimension (z) (e.g., width, diameter, etc.) parallel to the first major surface 102 and the second major surface 104 of the first substrate 100 (the horizontal dimension from the perspective of FIG. 9) of at least about twenty (20) nanometers, at least about fifty (50) nanometers, at least about one hundred (100) nanometers, or even greater.

The one or more apertures 140 may be formed through the relatively thin layer of material 120A using, for example, a photolithographic masking and etching process. In such embodiments, a mask layer may be deposited over the first major surface 130 of the relatively thin layer of material 120A on a side thereof opposite the first substrate 100 and selectively patterned to form openings through the mask layer at the locations at which it is desired to etch into the relatively thin layer of material 120A to form the apertures 140. After forming the patterned mask layer, the region of the relatively thin layer of material 120A that is exposed through the openings of the patterned mask layer may be etched using, for example, a wet chemical etch process or a dry reactive ion etching process. Although the illustrated non-limiting example illustrates a single aperture extending through the relatively thin layer of material 120A, any number of apertures 140 may be formed through the relatively thin layer of material 120A, and each of the one or more apertures 140 may be aligned with the sacrificial material 110.

In some embodiments, the one or apertures 140 may be aligned with the underlying sacrificial material 110 such that the apertures 140 are aligned with the center of the sacrificial material 110 in the horizontal plane parallel to the first major surface 102 and the second major surface 104 of the first substrate 100. In some embodiments, the apertures 140 may be within a distance of the center of the sacrificial material 110 that is about ten (10) percent or less of the average cross-sectional dimension of the cavity 106, about twenty (20) percent or less of the average cross-sectional dimension of the cavity 106, or even about fifty (50) percent or less of the average cross-sectional dimension of the cavity 106. In alternative embodiments, the one or more apertures 140 may be aligned such that the one or more apertures 140 are located vertically over other portions of the sacrificial material 110.

In some embodiments, an anisotropic etch process may be utilized for forming the one or more apertures 140. An anisotropic etch process may be utilized to substantially maintain the average cross-sectional dimension (z) of the one or more apertures 140 throughout the entire depth of the apertures 140. For example, in non-limiting examples, the anisotropic etch process may maintain the average cross-sectional dimension (z) through the entire depth of the one or more apertures 140 within at least approximately five (5) percent, within at least approximately ten (10) percent, or even within at least approximately twenty (20) percent of the original pre-etched cross-sectional dimension (z) dimension. Although the average cross-sectional dimensions (z) of the two apertures 140 are illustrated in FIG. 9 as being substantially equal, it should be appreciated that in other embodiments the apertures 140 may have differing average cross-sectional dimensions (z).

An anisotropic dry reactive ion etch process may be utilized to form the one or more apertures 140 through the relatively thin layer of material 120A from the first major surface 130. An anisotropic dry etching process may be utilized to form the apertures 140 to substantially prevent etching of the exposed sidewalls 142 of the thin layer of material 120A within the one or more apertures 140. In additional embodiments, an anisotropic wet etch may be utilized. After the etching process, the patterned mask layer may be removed.

In some embodiments, the etching process may utilize two or more etch (wet or dry) chemistries depending on the composition of the material(s) being removed. For example, a first etch chemistry may be utilized to remove portions of the protective dielectric layer 136, a second etch chemistry may be used to remove portions of the relatively thin layer of material 120A, and a third etch chemistry may be utilized to remove portions of a bonding layer 116. In embodiments in which the bonding layer 116 and the protective dielectric layer 136 comprise substantially the same material, the first etch chemistry and the third etch chemistries may be substantially the same.

Figure 10:
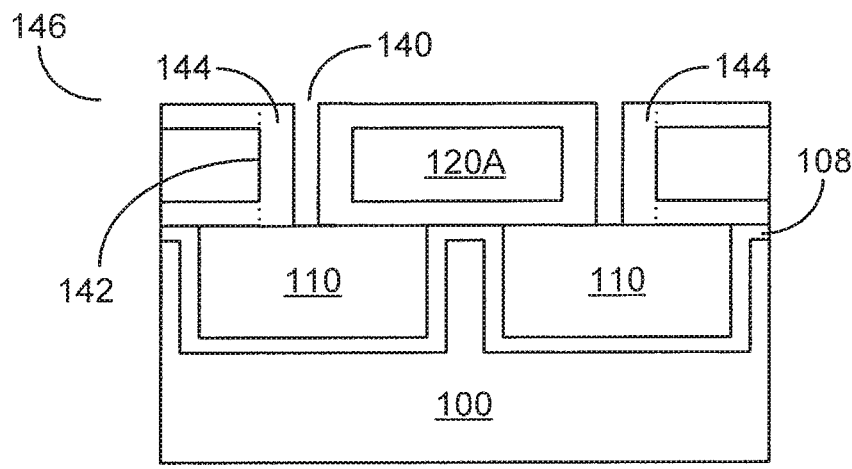

Upon formation of the one or more apertures 140, an additional protective dielectric layer 144 may be formed over the exposed sidewalls 142 of the thin layer of material 120A within the apertures 140 to form the intermediate structure 146 illustrated in FIG. 10. The additional protective dielectric layer 144 may be formed over the exposed sidewalls 142 of the relatively thin layer of material 120A to substantially cover the entire surface of the sidewalls 142. The additional protective dielectric layer 144 may be formed using one or more of a deposition process (e.g., a physical vapor deposition (PVD) process or a chemical vapor deposition (CVD) process) and a growth process, such as a thermal growth process (e.g., thermal oxidation or thermal nitridation). The additional protective dielectric layer 144 may be formed to an average layer thickness of greater than about twenty (20) nanometers, greater than about forty (40) nanometers, or even greater than about sixty (60) nanometers. In some embodiments, the additional protective dielectric layer 144 may be thermally treated to increase the density of the additional protective dielectric layer 144. As a non-limiting example, the additional protective dielectric layer 144 may be heated in a suitable furnace to a temperature of greater than approximately 400° C. to densify the additional protective dielectric layer 144.

As a non-limiting example, the additional protective dielectric layer 144 may comprise one or more layers, which may include a silicon oxide layer and/or a silicon nitride layer. For example, the additional protective dielectric layer 144 may comprise a silicon oxide (e.g., $SiO_2$) layer conformally formed over the sidewalls 142 of the thin layer of material 120A within the one or more apertures 140 by a thermal oxidation growth process. Thermal oxidation growth processes may be utilized due to the inherent conformality of the thermal growth process over the sidewalls 142 of the thin layer of material 120A within the one or more apertures 140, thereby ensuring at least substantial coverage of the entirety of the sidewalls 142.

Figure 11:
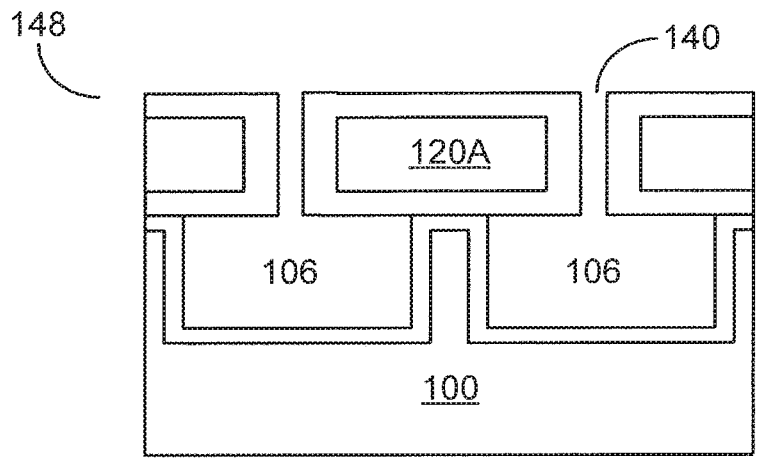

The one or more apertures 140 extending through the relatively thin layer of material 120A may be utilized to allow the removal of the sacrificial material 110 from within the one or more cavities 106. As illustrated in FIG. 11, the removal of the sacrificial material 110 from the cavities 106 may "release" the relatively thin layer of material 120A from the remaining portion of the structure. The released and unsupported portion of the relatively thin layer of material 120A may function as a membrane for a subsequent MEMS transducer fabricated from the semiconductor structure 148. In addition, the removal of the sacrificial material 110 again restores the voids in the one or more cavities 106, which may be utilized as MEMS cavities for a subsequent MEMS transducer fabricated from the semiconductor structure 148.

In non-limiting embodiments, an etchant may pass through the one or more apertures 140 such that the sacrificial material 110 may be removed out from the cavities 106 through the apertures 140 using an etchant selective to the sacrificial material 110 relative to the liner material 108. In other words, the sacrificial material 110 may be removed at a substantially greater rate than the materials(s) comprising the liner material 108 and the protective dielectric layers 136, 144. In addition, the sacrificial material 110 may be removed at a substantially greater rate than that of the bonding layer 116, the protective dielectric layer 136, and the additional protective dielectric layer 144. In some embodiments, the sacrificial material 110 may be removed without substantial removal of the material(s) comprising the liner material 108, the bonding layer 116 and the protective dielectric layers 136, 144.

An etchant may be selected that will etch the sacrificial material 110 at a first etch rate that is higher than a second etch rate at which the etchant will etch the liner material 108 (and any etch rate of the bonding layer 116 and/or the protective dielectric layers 136, 144). The first etch rate may be at least about five (5) times higher than the second etch rate, at least about one hundred (100) times higher than the second etch rate, or even at least about one thousand (1,000) times higher than the second etch rate in some embodiments. In this configuration, the liner material 108 (and the bonding layer 116 and/or the protective dielectric layers 136, 144) may serve as etch stop layers in the etching process used to remove the sacrificial material 110 from within the one or more cavities 106. In other words, the sacrificial material 110 is removed progressively from within the one or more cavities 106 at the first etch rate. When the sacrificial material 110 is at least substantially removed and an underlying surface of the liner material 108 is exposed, the etching process will effectively stop, due to the fact that the etch rate will be significantly reduced to the slower, second etch rate.

The etching process used to etch the sacrificial material 110 from within the one or more cavities 106 may comprise a wet etching process, a dry etching process (e.g., a plasma etching process), or an electrochemical etching process.

The composition of the etchant or etchants employed in the etching process will depend upon the composition of the sacrificial material 110 and the surrounding materials, such as the liner material 108. Many suitable etchants for such materials are known in the art and may be employed in embodiments of the present disclosure. As one non-limiting example, in embodiments in which the sacrificial material 110 comprises polycrystalline silicon and the liner material 108 comprises one or more of a silicon oxide and a silicon nitride, the etchant may comprise tetramethylammonium hydroxide (TMAH). Typical TMAH etching temperatures are employed at temperatures between 70° C. and 90° C., and typical concentrations are 3-25 wt % TMAH in water. In some embodiments in which the sacrificial material 110 comprises polycrystalline silicon, a selective isotropic carbon tetrafluoride ($CF_4$) etch may also be utilized.

In other non-limiting examples, the sacrificial material 110 may comprise a glassy material, such as, for example, an inorganic spin-on-glass (i.e., methyl-, ethyl-, phenyl-, or butyl), a doped or undoped silicate glass, a doped or undoped quasi-inorganic siloxane spin-on-glass (SOG), a phosphosilicate glass (PSG), a borosilicate glass (BSG), or borophosphosilicate glass (BPSG). In embodiments in which the sacrificial material 110 comprises a glassy material, the liner material 108 may comprise a silicon dioxide material and an overlying silicon nitride material. The etchant may comprise a hydrofluoric acid (HF) based etch chemistry, such as concentrated HF (49% HF in water), a buffered oxide etch comprising, for example, ammonium fluoride ($NH_4F$) and hydrofluoric acid (e.g., a 7:1 volume ratio of 40% $NH_4F$ in water to 49% HF in water), and a HF/hydrochloric acid (HCl) etch solution (e.g., 1:1 HF:HCl).

In embodiments in which the sacrificial material 110 comprises a polymeric material, such as a polyimide, or an acetate such as 1-methoxy-2-propanol acetate, the polymeric material may be removed with a suitable solvent such as ethyl lactate and diacetone alcohol. In such embodiments, the selected solvent removes the sacrificial material 110 without removing the adjacent liner material 108, bonding layer 116, and protective dielectric layers 136, 144.

Figure 13:
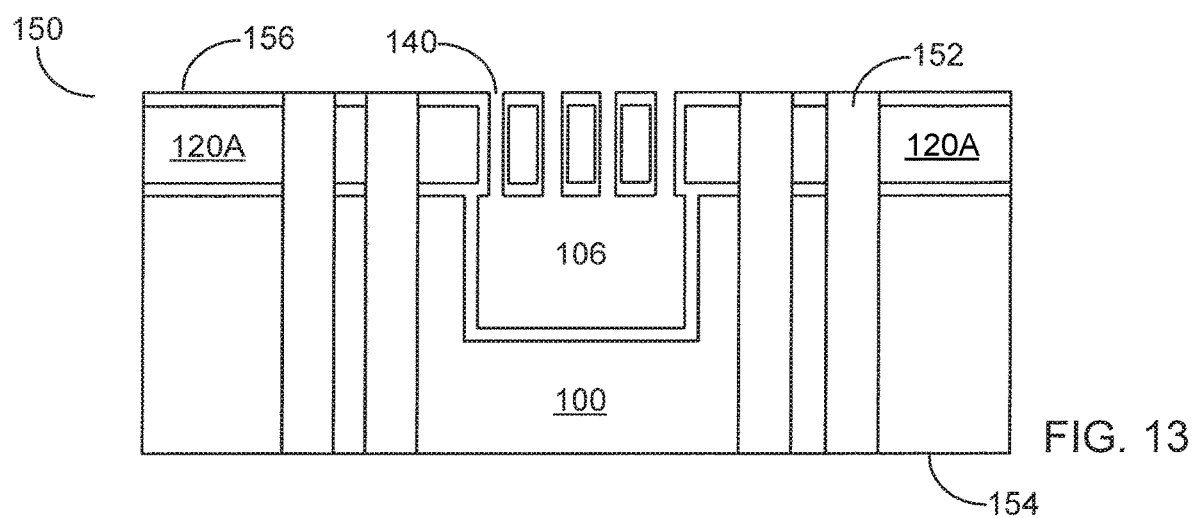

In further embodiments, the semiconductor structure 148 of FIG. 11 may be further processed to form a MEMS transducer. For example, as a non-limiting example, FIG. 13 illustrates a MEMS transducer 150 fabricated from semiconductor structure 148 of FIG. 11. The MEMS transducer 150 may comprise a single cavity 106, which may serve as a MEMS transducer cavity, and four (4) apertures 140 extending through the relatively thin layer of material 120A. Such structures may be utilized as a plate acoustic wave resonator, a flexural mode resonator, a bulk acoustic wave (BAW) resonator, a surface acoustic wave (SAW) resonator, or a film bulk acoustic resonator (FBAR). In other embodiments, the MEMS transducer 150 may comprise a sensor configured to electrically sense mechanical deformation of, or vibrations in, the MEMS transducer 150. In some embodiments, the MEMS transducer 150 may function as both a resonator and a sensor.

Through-substrate-vias 152 may be formed by masking and etching processes, and metal deposition processes to allow electrical connection between the MEMS transducer 150 and further semiconductor structures that may be formed on one or both major surfaces of the MEMS transducer 150. For example, active electronic devices, such as a CMOS based device, may be attached to a first major surface 154 of the MEMS transducer 150 (e.g., by a direct bonding process), and a MEMS cap may be provided over a second major surface 156 of the MEMS transducer 150 (e.g., by a direct bonding process), such that an electrical connection may be established between the CMOS device substrate, the MEMS transducer 150, and the MEMS cap structure.

The embodiments disclosed herein enable the formation of semiconductor structures comprising one or more cavities, and the semiconductor structures may be utilized for forming MEMS transducers.

Additional non-limiting example embodiments of the disclosure are set forth below.

Embodiment 1

A method of fabricating a semiconductor structure, comprising: forming one or more cavities in a first substrate, the one or more cavities extending at least partially into the first substrate from a first major surface of the first substrate; providing a sacrificial material within the one or more cavities; bonding a second substrate over the first major surface of the first substrate; thinning the second substrate by removing a relatively thick layer of the second substrate from the second substrate and leaving a relatively thin layer of the second substrate bonded over the first major surface of the first substrate; forming one or more apertures through the relatively thin layer of the second substrate; and removing the sacrificial material from within the one or more cavities out though the one or more apertures.

Embodiment 2

The method of Embodiment 1, further comprising forming the one or more cavities to have a total sum cross-sectional area in a plane parallel to the first major surface of the first substrate of at least thirty percent (30%) of a total area encompassed by a peripheral edge of the first substrate at the first major surface of the first substrate.

Embodiment 3

The method of Embodiment 1 or Embodiment 2, further comprising forming a liner material on or in surfaces of the first substrate within the one or more cavities prior to providing the sacrificial material within the one or more cavities.

Embodiment 4

The method of Embodiment 3, wherein removing the sacrificial material from within the one or more cavities comprises etching the sacrificial material using an etchant selective to the sacrificial material in relation to the liner material.

Embodiment 5

The method of Embodiment 3 or Embodiment 4, further comprising selecting the liner material to comprise at least one of a silicon oxide and a silicon nitride.

Embodiment 6

The method of any one of Embodiments 1 through 5, wherein providing the sacrificial material within the one or more cavities comprises: depositing the sacrificial material within the one or more cavities, the sacrificial material at least substantially filling the one or more cavities; and planarizing a surface of the sacrificial material by removing a portion of the sacrificial material.

Embodiment 7

The method of any one of Embodiments 1 through 6, further comprising depositing a bonding layer over the sacrificial material prior to bonding the second substrate over the first major surface of the first substrate.

Embodiment 8

The method of any one of Embodiments 1 through 7, wherein thinning the second substrate further comprises: implanting ions into the second substrate to form a fracture plane within the second substrate, the fracture plane disposed between the relatively thick layer of the second substrate and the relatively thin layer of the second substrate; and fracturing the second substrate along the fracture plane and separating the relatively thick layer of the second substrate from the relatively thin layer of the second substrate.

Embodiment 9

The method of any one of Embodiments 1 through 8, wherein forming the one or more apertures through the relatively thin layer of the second substrate comprises: etching one or more apertures through the relatively thin layer of the second substrate; and exposing a surface of the sacrificial material within the one or more apertures.

Embodiment 10

The method of Embodiment 9, further comprising forming a protective dielectric layer over an exposed surface of the relatively thin layer prior to removing the sacrificial material from within the one or more cavities out though the one or more apertures.

Embodiment 11

The method of Embodiment 9 or Embodiment 10, further comprising forming a protective dielectric layer over an exposed surface of the relatively thin layer within the one or more apertures prior to removing the sacrificial material from within the one or more cavities out though the one or more apertures.

Embodiment 12

The method of any one of Embodiments 1 through 11, further comprising forming a MEMS transducer from the semiconductor structure.

Embodiment 13

A semiconductor structure, comprising: one or more cavities extending at least partially through a first substrate from a first major surface of the first substrate; a sacrificial material disposed within the one or more cavities; a liner material extending over a surface of the first substrate within the one or more cavities, the liner material disposed between the surface of the first substrate and the sacrificial material; a relatively thin layer disposed over the first major surface of the first substrate and extending over the sacrificial material disposed within the one or more cavities; and one or more apertures extending through the relatively thin layer, the one or more apertures disposed adjacent the sacrificial material.

Embodiment 14

The semiconductor structure of Embodiment 13, further comprising a bonding layer disposed between the relatively thin layer and the sacrificial material.

Embodiment 15

The semiconductor structure of Embodiment 13 or Embodiment 14, wherein the sacrificial material comprises polycrystalline silicon.

Embodiment 16

The semiconductor structure of any one of Embodiments 13 through 15, wherein the one or more cavities have a total sum cross-sectional area in a plane parallel to the first major surface of the first substrate of at least thirty percent (30%) of a total area encompassed by a peripheral edge of the first substrate at the first major surface of the first substrate.

Embodiment 17

The semiconductor structure of any one of Embodiments 13 through 16, wherein the liner material comprises at least one of a silicon oxide and a silicon nitride.

Embodiment 18

The semiconductor structure of Embodiment 17, wherein the liner material comprises a silicon nitride layer disposed over a silicon oxide layer.

Embodiment 19

The semiconductor structure of Embodiment 17 or Embodiment 18, wherein the liner material comprises a silicon oxide layer having a thickness of about 20 nanometers or more.

Embodiment 20

The semiconductor structure of any one of Embodiments 17 through 19, wherein the liner material comprises a silicon nitride layer having a thickness of about 20 nanometers or more.

Embodiment 21

The semiconductor structure of any one of Embodiments 13 through 20, further comprising a protective dielectric layer over an exposed surface of the relatively thin layer.

Embodiment 22

The semiconductor structure of any one of Embodiments 13 through 21, further comprising a protective dielectric layer over an exposed surface of the relatively thin layer within the one or more apertures.

Embodiment 23

The semiconductor structure of any one of Embodiments 13 through 22, wherein the one or more cavities extends an average depth of at least about 1 micron into the first substrate from the first major surface of the first substrate.

Embodiment 24

The semiconductor structure of any one of Embodiments 13 through 23, further comprising a direct bonding interface disposed between the relatively thin layer and the sacrificial material.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. Such modifications and embodiments are also intended to fall within the scope of the appended claims.

What is claimed is:

1. A method of fabricating a resonator device selected from the group consisting of a bulk acoustic wave resonator, a surface acoustic wave resonator, and a film bulk acoustic resonator, the method comprising:
    providing a first substrate comprising a multi-layer structure including a layer comprising polycrystalline material;
    forming one or more cavities in the first substrate, the one or more cavities defined by one or more surfaces of the first substrate and extending at least partially into the first substrate from a first major surface of the first substrate;
    providing a sacrificial material within the one or more cavities;
    providing a first bonding layer on the first major surface of the first substrate, the first bonding layer comprising an oxide material, a nitride material, or a metallic material;
    providing a second bonding layer on a first major surface of a second substrate, the second substrate comprising a monocrystalline material, the second bonding layer comprising an oxide material, a nitride material, or a metallic material;
    bonding the second bonding layer of the second substrate to the first bonding layer of the first substrate using a direct bonding process to form a bonded structure including the first substrate and the second substrate;
    removing a portion of the second substrate from the bonded structure and leaving a relatively thin layer of the second substrate bonded over the first major surface of the first substrate, the relatively thin layer of the second substrate comprising the monocrystalline material;
    forming one or more apertures through the relatively thin layer of the second substrate, the first bonding layer, and the second bonding layer; and
    removing the sacrificial material from within the one or more cavities out through the one or more apertures,
    wherein each of the first bonding layer and the second bonding layer comprises a different material from the polycrystalline material and the monocrystalline material.

2. The method of claim 1, further comprising forming the one or more cavities to have a total sum cross-sectional area in a plane parallel to the first major surface of the first substrate of at least thirty percent (30%) of a total area encompassed by a peripheral edge of the first substrate at the first major surface of the first substrate.

3. The method of claim 2, further comprising forming the one or more cavities to have a total sum cross-sectional area in the plane parallel to the first major surface of the first substrate of at least fifty percent (50%) of the total area encompassed by the peripheral edge of the first substrate at the first major surface of the first substrate.

4. The method of claim 1, further comprising forming a liner material on or in surfaces of the first substrate within the one or more cavities prior to providing the sacrificial material within the one or more cavities.

5. The method of claim 4, wherein removing the sacrificial material from within the one or more cavities comprises etching the sacrificial material using an etchant selective to the sacrificial material in relation to the liner material.

6. The method of claim 5, further comprising selecting the liner material to comprise at least one of a silicon oxide and a silicon nitride.

7. The method of claim 1, wherein providing the sacrificial material within the one or more cavities comprises:
    depositing the sacrificial material within the one or more cavities, the sacrificial material at least substantially filling the one or more cavities; and
    planarizing a surface of the sacrificial material by removing a portion of the sacrificial material.

8. The method of claim 1, wherein forming the one or more apertures through the relatively thin layer of the second substrate comprises:
    etching one or more apertures through the relatively thin layer of the second substrate; and
    exposing a surface of the sacrificial material within the one or more apertures.

9. The method of claim 8, further comprising forming a protective dielectric layer over an exposed surface of the relatively thin layer prior to removing the sacrificial material from within the one or more cavities out through the one or more apertures.

10. The method of claim 9, further comprising forming a protective dielectric layer over an exposed surface of the relatively thin layer within the one or more apertures prior to removing the sacrificial material from within the one or more cavities out through the one or more apertures.

11. The method of claim 1, wherein the first bonding layer of the first substrate and the second bonding layer of the second substrate comprise silicon oxide.

12. The method of claim 11, wherein the polycrystalline material comprises polycrystalline silicon.

13. The method of claim 1, further comprising implanting ions into the second substrate to form a fracture plane within the second substrate prior to bonding the second bonding layer of the second substrate to the first bonding layer of the first substrate, and wherein removing the portion of the second substrate from the bonded structure comprises fracturing the second substrate along the fracture plane and separating a relatively thick layer of the second substrate from the relatively thin layer of the second substrate.

14. A semiconductor device, comprising:
    a resonator device selected from the group consisting of a bulk acoustic wave resonator, a surface acoustic wave resonator, and a film bulk acoustic resonator, wherein the resonator device includes:
        a substrate comprising a multi-layer structure including a layer of polycrystalline material, one or more surfaces of the substrate defining one or more cavities in the substrate, the one or more cavities extending at least partially into the substrate from a first major surface of the substrate;
        a layer of monocrystalline material bonded over the substrate; and
        a bonding layer between the layer of monocrystalline material and the substrate, the bonding layer comprising a different material from the polycrystalline material and the monocrystalline material, the bonding layer comprising an oxide material, a nitride material, or a metallic material,
        the layer of monocrystalline material defining one or more apertures extending through the layer of monocrystalline material to the one or more cavities in the substrate.

15. The semiconductor device of claim 14, wherein the one or more cavities have a total sum cross-sectional area in a plane parallel to the first major surface of the substrate of at least thirty percent (30%) of a total area encompassed by a peripheral edge of the substrate at the first major surface of the substrate.

16. The semiconductor device of claim 15, wherein the one or more cavities have a total sum cross-sectional area in the plane parallel to the first major surface of the substrate of at least fifty percent (50%) of the total area encompassed by the peripheral edge of the substrate at the first major surface of the substrate.

17. The semiconductor device of claim 14, further comprising a liner material on or in surfaces of the substrate within the one or more cavities.

18. The semiconductor device of claim 17, wherein the liner material comprises at least one of a silicon oxide and a silicon nitride.

19. The semiconductor device of claim 14, wherein the bonding layer between the layer of monocrystalline material and the substrate comprises silicon oxide.

20. The semiconductor device of claim 14, wherein the polycrystalline material comprises polycrystalline silicon.

* * * * *